United States Patent
Morita

(10) Patent No.: US 6,254,429 B1
(45) Date of Patent: Jul. 3, 2001

(54) SURFACE-MOUNT CONNECTOR WITH HIGH-DEGREE FLATNESS

(75) Inventor: Shigehiro Morita, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 09/328,259

(22) Filed: Jun. 10, 1999

(30) Foreign Application Priority Data

Oct. 1, 1998 (JP) .................................................. 10-279925

(51) Int. Cl.[7] ............................. H01R 13/60; H01R 13/66
(52) U.S. Cl. ............................. 439/570; 439/563; 439/566
(58) Field of Search ..................................... 439/570, 571, 439/572, 563, 566

(56) References Cited

U.S. PATENT DOCUMENTS

| | | | |
|---|---|---|---|
| 5,096,440 | * 3/1992 | Katsumata | 439/570 |
| 5,445,529 | * 8/1995 | Yamamoto | 439/81 |
| 5,704,807 | * 1/1998 | Sherman et al. | 439/570 |
| 5,931,689 | * 8/1999 | Patel | 439/346 |
| 5,934,936 | * 8/1999 | Chiu et al. | 439/570 |

* cited by examiner

Primary Examiner—Brian Sircus
Assistant Examiner—Hae Moon Hyeon
(74) Attorney, Agent, or Firm—Kanesaka & Takeuchi

(57) ABSTRACT

The connector comprises a housing (7) having a soldering portion (6, 15A or 15B) and a reinforcing metal member (5) movably attached to the housing such that it is vertically movable when it is soldered to a board (12). The reinforcing metal member is provided with a groove (14) to form with the solderable portion a gap between them, which permits soldering by capillary effects.

7 Claims, 3 Drawing Sheets

SURFACE-MOUNT CONNECTOR WITH HIGH-DEGREE FLATNESS

BACKGROUND OF THE INVENTION

1. Field of the Invention

The present invention relates to surface-mount connector with a reinforcing metal member and, particularly, to a surface-mount connector with a movably attached reinforcing metal member (and lead terminals).

2. Description of the Related Art

FIG. 6 shows a conventional surface-mount connector with a reinforcing metal member. This connector is of the "header" type and is used together with a receptacle type connector. As apparent from the following description, the present invention is applicable to a variety of connector types in addition to both the above types.

The surface-mount connector is fixed to a board by soldering a plurality of lead terminals 1 which are press fixed to the connector. In such a connector, it is difficult to provide high degrees of flatness of surface mount because of errors in press fit positions. A pair of reinforcing metal members 2 are provided to fix the connector to the board more securely. They are fixed to the housing 3 and then soldered to the board. It is also difficult to have the reinforcing metal members 2 flush with the lead terminals 1. Consequently, it is difficult to fix the connector to the board at a predetermined height. Accordingly, there is a demand for a connector having a high degree of flatness of surface mount.

Accordingly, it is an object of the invention to provide a connector with a reinforcing metal member (and lead terminals) having an adjustable height to thereby provide high degrees of flatness of surface mount.

According to one aspect of the invention there is provided a surface-mount connector comprising a housing having a solderable portion; a plurality of lead terminals movably attached to the housing and soldered to a board to thereby fix the surface-mount connector; the lead terminals being provided so as to form a gap between the lead terminals and the solderable portion of the housing such that the gap enables soldering by capillary effects.

According to another aspect of the invention there is provided a surface-mount connector with a reinforcing metal member comprising a housing having a solderable portion; a reinforcing metal member movably attached to the housing such that it is movable with respect to a board when it is soldered to the board; the reinforcing metal member being provided so as to form a gap between the reinforcing metal member and the solderable portion of the housing such that the gap enables soldering by capillary effects.

According to still another aspect of the invention there is provided a surface-mount connector comprising a housing; a fixing metal member fixed to the housing; a plurality of lead terminals movably attached to the housing such that the lead terminals are movable with respect to a board when they are soldered to the board; the lead terminal and the fixing metal member being provided so as to form a gap between them such that the gap enables soldering by capillary effects.

According to yet another aspect of the invention there is provided a surface-mount connector with a reinforcing metal member, comprising a housing; a fixing metal member fixed to the housing; a reinforcing metal member movably attached to the housing such that the reinforcing metal member is movable with respect to a board when it is soldered to the board; the reinforcing and fixing metal members being provided so as to form a gap between them such that the gap enables soldering by capillary effects.

According to one embodiment of the invention there is provided the surface-mount connector, wherein the lead terminal is vertically movable with respect to the board when it is soldered to the board.

According to another aspect of the invention there is provided a surface-mount connector with a reinforcing metal member, comprising a housing made from a shield plate; a reinforcing metal member movably attached to the shield plate such that the reinforcing metal member is movable with respect to a board when it is soldered to the board; the reinforcing metal member and the shield plate being provided so as to form a gap between them such that the gap enables soldering by capillary effects.

According to another embodiment of the invention there is provided the surface-mount connector, wherein the lead terminals or reinforcing metal member is vertically movable with respect to the board.

According to still another embodiment of the invention there is provided the surface-mount connector, which further comprises a groove provided in one or both of the gap forming members.

DESCRIPTION OF THE PREFERRED EMBODIMENT

Figure 1:
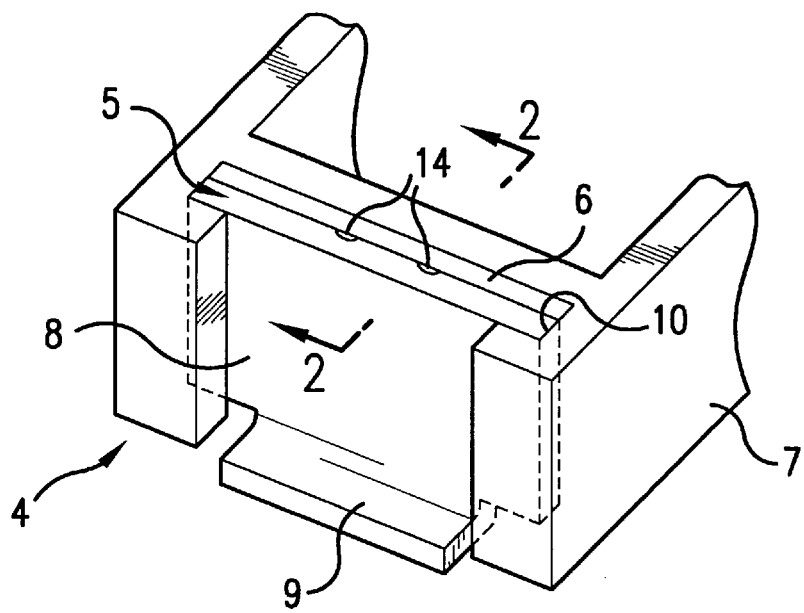
FIG. 1 is a perspective view of an end portion of a surface-mount connector according to an embodiment of the invention.

FIG. 1 shows an end of a surface-mount connector according to an embodiment of the invention, with the other end having the same structure. A connector 4 comprises a plurality of lead terminals, a pair of reinforcing metal members 5, a pair of fixing metal members 6, and a housing 7.

Figure 6:
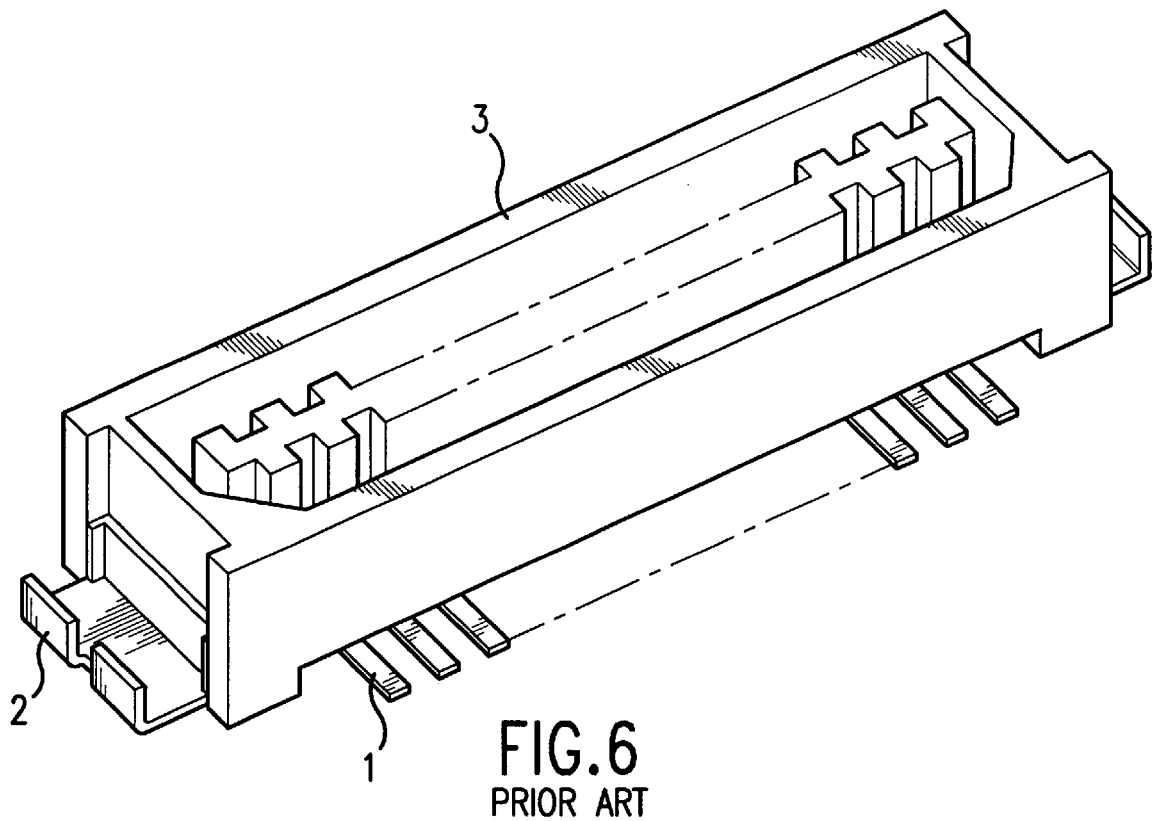
FIG. 6 is a conventional surface-mount connector with a reinforcing metal member.

The lead terminals are not shown for simplification but, as shown in FIG. 6, are provided along the length of the housing 7 such that the end portions project outwardly from the bottom of the housing 7. The lead terminals are fixed to the housing (or, hereinafter described, are movable with respect to the housing). The end portions are soldered to traces of a board by the reflow process.

The reinforcing metal members 5 are used to firmly secure the connector to the board. They have an L-shaped section. The vertical section 8 is not only supported by the housing 7 but also fixed to the fixing metal member 6 while the horizontal section 9 is fixed to the board. The reinforcing metal members 5 are not always fixed to the housing but movable with respect to the housing when they are soldered to the board and then fixed to the housing after the soldering.

The fixing metal member 6 is used to fix the reinforcing metal member 5 to the housing 7. Its shape and size are substantially the same as the vertical sections of the reinforcing metal member 5. It is not necessary when the housing is made from a metal or a material which can be soldered, but it is necessary when the housing is made from a resin or a material which cannot be soldered. When the housing is made from a material which cannot be soldered, the fixing metal member is provided near the reinforcing metal member to fix the reinforcing metal member to the housing indirectly.

Upon assembling, the reinforcing and fixing metal members 5 and 6 are held in the accommodation section 10 at an end of the housing 7. The accommodation section 10 extends vertically from the bottom of the housing so that the fixing metal member 6 does not fall from the accommodation section. The width of the vertical support section 8 of the reinforcing metal member 5 is slightly smaller than that of the accommodation section 10 while the width of the fixing metal member 6 is slightly larger than that of the accommodation section 10. The thickness of the reinforcing and fixing metal members 5 and 6 are substantially equal, with the total thickness of these is slightly smaller than that of the accommodation section 10. Consequently, the fixing metal member 6 is press fixed to the accommodation section 10 so that it is fixed to the housing 7 while the reinforcing metal member 5 is not fixed to the housing 7 when the housing is soldered to the board. Thus, unlike the fixing metal member 6, the reinforcing metal member 5 is vertically movable with respect to the housing.

When the connector is fixed to the board, it is possible to adjust the height of the reinforcing metal member 5 to thereby maximize the degree of flatness of the connector with respect to the board. That is, it is possible to fix the connector in parallel to the board by automatic adjustment in accordance with the varying distances between the housing and the board due to different materials of the lead terminals and the reinforcing metal members. The height adjustment is made automatically by free fall of the reinforcing metal member or pushing-up of the reinforcing metal member by the board, and no manual or mechanical operation is necessary.

A pair of semi-circular grooves 14 extend vertically in the center of the reinforcing metal member 5 to form small gaps between the grooves 14 and the fixing metal member 6. These gaps enable to solder the reinforcing and fixing metal members 5 and 6 as described below.

Figure 2:
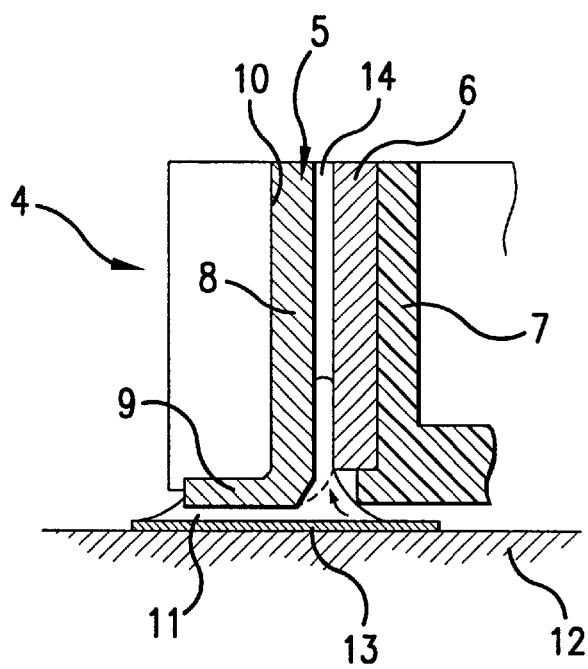
FIG. 2 is a sectional view taken along line 2—2 of FIG. 1.

How to solder the reinforcing and fixing metal members, and the reinforcing metal member and the board will be described with reference to FIG. 2, which is a section taken along line 2—2 of FIG. 1 and shows the gap between the groove of the reinforcing metal member 5 and the fixing metal member 6. A solder cream 11 is provided at a predetermined portion of a pad 13 on a board 12 to fix the reinforcing metal member 5 to both the board 12 and the fixing metal member 6. The solder cream 11 is melted in the reflow process for the lead terminals to fill a gap between the reinforcing metal member 5 and the pad 13. At the same time, it fills the gap between the groove 14 of the reinforcing metal member and the fixing metal member 6 by the capillary effects. The solder cream then is let to become cool and solid to thereby secure the reinforcing metal member 5 to the board 12 and the fixing metal member 6. The solder cream is suitable for soldering by the capillary effects but other solder may be used. The groove 14 may be replaced with any gap between the reinforcing and fixing metal members which is able to achieve soldering by the capillary effects.

As has been described above, according to the invention it is possible to maintain the adjusted height of the reinforcing metal member throughout a series of operations by providing the reinforcing metal member in movable relation to the fixing metal member and soldering the reinforcing metal member to both the connector and the board by the reflow process for soldering lead terminals to the board.

Other embodiments of the invention will be described with reference to, FIGS. 3 and 4. A pair of metal sheets or shield plates 15A or 15B are used to form a housing 7 to eliminate the fixing metal members 6 so that a reinforcing metal member 5A or 5B can be soldered directly to the shield plates 15A or 15B.

Figure 3:
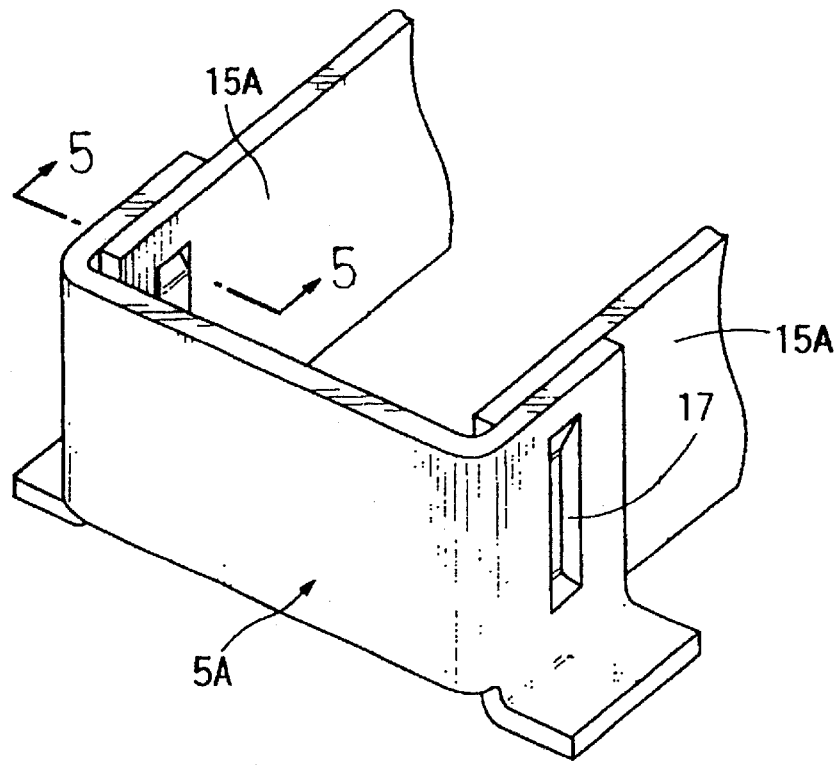
FIG. 3 is a perspective view of an end portion of a surface-mount connector according to another embodiment of the invention.
Figure 4:
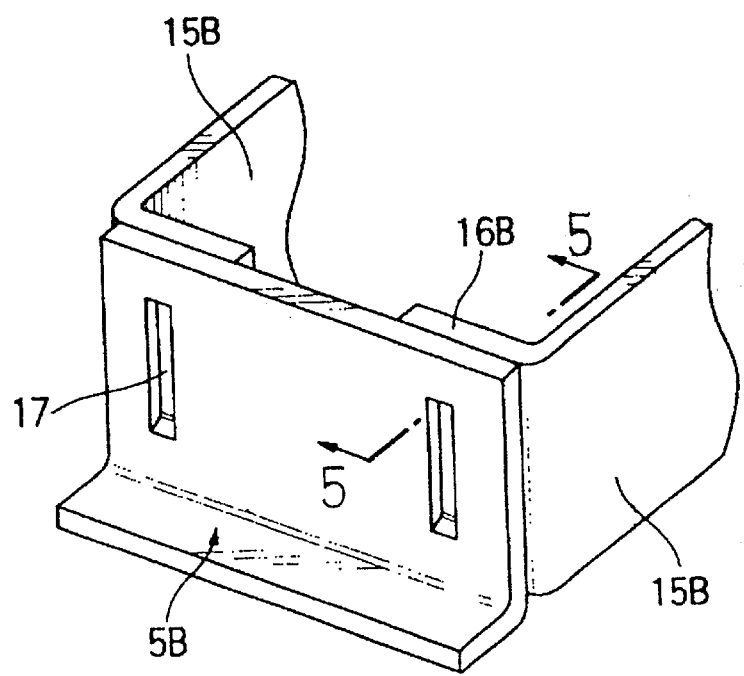
FIG. 4 is a perspective view of an end portion of a surface-mount connector according to still another embodiment of the invention.

In FIG. 3, the flat shield plates 15A are attached to the inside walls of the C-shaped reinforcing metal member 5A while, in FIG. 4, the L-shaped shield plates 15B have bends 16B which are attached to the reinforcing metal member 5B. An opening 16 (FIG. 5) is provided in each of the shield plates 15A and 15B while a pair of protruded portions 17 are provided in the vertical section of the reinforcing metal member 5A or 5B. Consequently, the reinforcing metal members 5A and 5B are attached to the shield plates such that they are vertically movable with respect to the board, permitting automatic adjustment in height of the reinforcing metal members.

Figure 5:
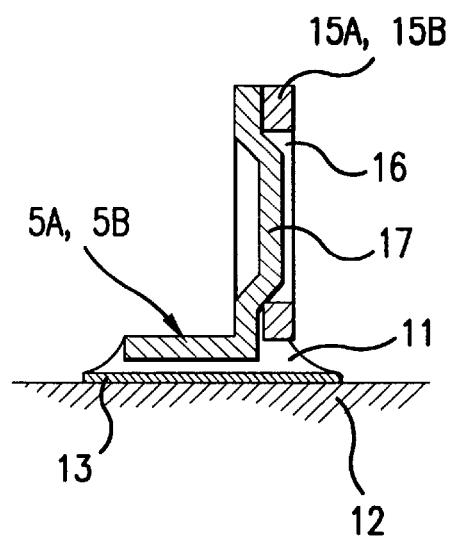
FIG. 5 is a sectional view taken along line V—V of FIGS. 3 or 4.

FIG. 5 is a sectional view taken along line V—V of FIG. 3 or 4. When lead terminals are soldered to a board by the reflow process, the reinforcing metal members 5A and 5B are soldered by the heat to both the connector and the board. Thus, it is easy to secure the connector to the board.

In the same manner as the reinforcing metal members are movably attached to the housing, it is possible to movably attach lead terminals to the housing. In FIG. 1, for example, if the reinforcing metal member 5 is assumed to be a lead terminal, the connector is conceivable to extend laterally. The reflow process by heat described above may be replaced by a reflow process by ultrasonic or laser. Where the shield plate is provided in the middle of a connector, the reinforcing metal member may be movably attached to the central shield plate in the same manner as described above. The invention is applicable to other surface-mount connectors than that of FIG. 6. The groove to form a gap may be provided in the fixing metal member or shield plate, or a combination of the reinforcing metal member or lead terminal and fixing metal member or shield plate.

In FIG. 7, lead terminals 20 are movably attached to a housing 7' such that a gap 22 is provided between each lead terminal 20 and the fixing metal member 6. Alternatively, the housing 7' may be made from a metal or a material which can be soldered so that the fixing metal members 6 can be eliminated and a gap is provided between each lead terminal and the solderable portion of the housing 7'.

According to the invention, the height of the reinforcing metal members (or lead terminals) are automatically adjusted so that the degree of flatness of the connector with respect to the board is increased.

What is claimed is:

1. A surface-mount connector comprising:
   a housing (7) having at least one solderable portion;
   at least one lead terminal supported by said housing;
   at least one reinforcing metal member (5) movably attached to said housing such that said reinforcing metal member is movable with respect to a board (12) when it is soldered to said board to fix said surface-mount connector; and
   means (14) for forming a gap between said reinforcing metal member and said solderable portion of said housing such that said reinforcing metal member is fixed to said solderable portion by soldering by capillary effects.

2. A surface-mount connector comprising:

a housing (7);

at least one lead terminal supported by said housing;

at least one fixing metal member (6) fixed to said housing;

at least one reinforcing metal member (5) movably attached to said such that said reinforcing metal member is movable with respect to a board (12) when it is soldered to said board to fix said surface-mount connector; and means (14) for forming a gap between said fixing metal member and said reinforcing metal member such that said reinforcing metal member is fixed to said fixing metal member by soldering by capillary effects.

3. The surface-mount connector according to claim 1, wherein said lead terminal is vertically movable with respect to said board when it is soldered to said board.

4. The surface-mount connector according to claim 2, wherein said lead terminal is vertically movable with respect to said board when it is soldered to said board.

5. A surface-mount connector comprising;

a housing made from at least one shield plate (15A or 15B);

at least one lead terminal supported by said housing;

at least one reinforcing metal member (5A or 5B) movably attached to said shield plate such that said reinforcing metal member is movable with respect to a board (12) when it is soldered to said board to fix said surface-mount connector; and means (16 and 17) for forming a gap between said reinforcing metal member and said shield plate such that said reinforcing metal member is fixed to said shield plate by soldering by capillary effects.

6. The surface-mount connector according to claim 5, wherein said lead terminal is vertically movable with respect to said board.

7. The surface-mount connector according to one of claims 1–5, which further comprises a groove provided in one or both of said gap forming members.

* * * * *